(12) United States Patent
Kurtin et al.

(10) Patent No.: US 9,680,072 B2
(45) Date of Patent: Jun. 13, 2017

(54) QUANTUM DOT (QD) DELIVERY METHOD

(71) Applicant: Pacific Light Technologies Corp., Portland, OR (US)

(72) Inventors: Juanita N. Kurtin, Hillsboro, OR (US); Michael Jansen, Palo Alto, CA (US)

(73) Assignee: Pacific Light Technologies Corp., Portland, OR (US)

(*) Notice: Subject to any disclaimer, the term of this patent is extended or adjusted under 35 U.S.C. 154(b) by 142 days.

(21) Appl. No.: 14/799,495

(22) Filed: Jul. 14, 2015

(65) Prior Publication Data
US 2015/0318455 A1 Nov. 5, 2015

Related U.S. Application Data

(63) Continuation-in-part of application No. 14/341,657, filed on Jul. 25, 2014, which is a continuation-in-part
(Continued)

(51) Int. Cl.
*H01L 33/56* (2010.01)
*H01L 33/50* (2010.01)
(Continued)

(52) U.S. Cl.
CPC .............. *H01L 33/56* (2013.01); *B29C 31/06* (2013.01); *C08K 3/10* (2013.01); *C08K 7/00* (2013.01);
(Continued)

(58) Field of Classification Search
CPC ............................. H01L 33/56; H01L 33/502
See application file for complete search history.

(56) References Cited

U.S. PATENT DOCUMENTS 6,105,822 A * 8/2000 Larsen ................. B29B 7/7447
222/134
7,041,362 B2 5/2006 Barbera-Guillem
(Continued)

FOREIGN PATENT DOCUMENTS

DE 102005013070 10/2005
JP 2007-524119 8/2007
(Continued)

OTHER PUBLICATIONS

International Preliminary Report on Patentability for International Patent Application No. PCT/US2014/020813, mailed Sep. 17, 2015.
(Continued)

*Primary Examiner* — Robert B Davis
(74) *Attorney, Agent, or Firm* — Blakely Sokoloff Taylor & Zafman LLP

(57) ABSTRACT

An LED is fabricated with a composite layer including quantum dots (QDs), wherein the QDs are provided in a silicone paste. A plurality of QD silicone paste reservoirs each contain a provided silicone paste with QDs of different wavelengths. Further, a silicone paste reservoir containing a clear silicone paste. A paste mixing chamber, in to which the QD paste reservoirs and the silicone paste reservoir supply their respective pastes, mixes together the pastes and form a mixed QD silicone paste. A silicone mixing and metering component receives the mixed QD silicone paste from the paste mixing chamber, and further receives A silicone and B silicone from a respective A silicone reservoir and a B silicone reservoir, measures, and mixes the mixed QD silicone paste with the A and B silicones to form a silicone polymer composite. A dispensing component receives to the silicone polymer composite from the mixing and metering component and dispenses the composite to a molding tool.

7 Claims, 15 Drawing Sheets

Related U.S. Application Data of application No. 14/196,123, filed on Mar. 4, 2014, now abandoned.

(60) Provisional application No. 61/773,084, filed on Mar. 5, 2013.

(51) Int. Cl.
| | |
|---|---|
| *B29C 31/06* | (2006.01) |
| *C09D 5/22* | (2006.01) |
| *C09K 11/02* | (2006.01) |
| *C09K 11/08* | (2006.01) |
| *C08K 3/10* | (2006.01) |
| *C09D 17/00* | (2006.01) |
| *C08K 7/00* | (2006.01) |
| *C08K 9/10* | (2006.01) |
| *B29K 83/00* | (2006.01) |
| *B29L 31/34* | (2006.01) |
| *B82Y 40/00* | (2011.01) |

(52) U.S. Cl.
CPC .............. *C08K 9/10* (2013.01); *C09D 5/22* (2013.01); *C09D 17/00* (2013.01); *C09K 11/02* (2013.01); *C09K 11/08* (2013.01); *H01L 33/502* (2013.01); *B29K 2083/00* (2013.01); *B29K 2995/0026* (2013.01); *B29K 2995/0036* (2013.01); *B29L 2031/3406* (2013.01); *B82Y 40/00* (2013.01); *Y10S 977/89* (2013.01)

(56) References Cited

U.S. PATENT DOCUMENTS

| 7,151,047 | B2 | 12/2006 | Chan |
|---|---|---|---|
| 7,498,177 | B2 | 3/2009 | De La Fuente |
| 7,598,314 | B2 | 10/2009 | Lee et al. |
| 7,811,470 | B2 | 10/2010 | Hayes |
| 7,976,726 | B2 | 7/2011 | Wang |
| 8,889,457 | B2 | 11/2014 | Kurtin |
| 2006/0105481 | A1 | 5/2006 | Boardman et al. |
| 2006/0157686 | A1* | 7/2006 | Jang ................. B82Y 10/00 257/14 |
| 2007/0185261 | A1 | 8/2007 | Lee et al. |
| 2010/0003528 | A1 | 1/2010 | Rozhin et al. |
| 2010/0123155 | A1* | 5/2010 | Pickett ............ B82Y 15/00 257/98 |
| 2010/0276638 | A1 | 11/2010 | Liu et al. |
| 2011/0068321 | A1 | 3/2011 | Pickett |
| 2011/0240931 | A1 | 10/2011 | Jang et al. |

FOREIGN PATENT DOCUMENTS

| KR | 10-2012-0035152 | 4/2012 |
|---|---|---|
| WO | WO-2005/0675242 | 7/2005 |
| WO | WO-2008/025962 | 3/2008 |
| WO | WO-2010/109465 | 9/2010 |
| WO | WO-2011/109299 | 9/2011 |
| WO | WO-2012/078582 | 6/2012 |

OTHER PUBLICATIONS

Non-Final Office Action for U.S. Appl. No. 14/196,123, mailed Oct. 15, 2015.
Non-Final Office Action for U.S. Appl. No. 14/341,657, mailed Dec. 17, 2015.
Final Office Action for U.S. Appl. No. 14/196,123, Mailed Apr. 14, 2016.
Final Office Action for U.S. Appl. No. 14/341,657, Mailed May 12, 2016.
Extended European Search Report for European Patent Application No. 14759513.6, mailed Oct. 11, 2016.
European Search Opinion for European Patent Application No. 14759513.6, mailed Oct. 26, 2016.
International Search Report and Written Opinion for International Patent Application No. PCT/US2014/020813, mailed Jun. 20, 2014.
Non-Final Office Action from U.S. Appl. No. 14/341,657 mailed Dec. 2, 2016, 16 pgs.

* cited by examiner

WHITE LIGHT

QUANTUM DOT (QD) DELIVERY METHOD

CROSS-REFERENCE TO RELATED APPLICATIONS

This application claims the benefit of U.S. Provisional Application No. 61/773,084, filed Mar. 5, 2013, the entire contents of which are hereby incorporated by reference herein, and to U.S. Nonprovisional patent application Ser. No. 14/196,123 filed Mar. 4, 2014, and to U.S. Nonprovisional patent application Ser. No. 14/341,657, filed Jul. 25, 2014.

TECHNICAL FIELD

Embodiments of the present invention are in the field of quantum dots and, in particular, quantum dot delivery methods.

BACKGROUND

In the prior art, white LEDs are made using blue LEDs with a silicone/phosphor mixture on top of an emitting region for the LEDs. The mixture converts blue light to white light. Current technology largely uses inorganic phosphor powders mixed in silicone for the mixture. The silicone is optically transparent, serves as a binder for the phosphor, and also has an index of refraction intermediate between the chip and air for better extraction of blue and white photons.

Phosphor powders are weighed and blended to achieve the correct color targets characterized by CCT and CRI specifications of the LED manufacturer; targets which are tailored for specific applications and market segments (illumination, display, automotive, flash, etc.). Illumination, in particular, requires a large number of phosphor-silicone combinations that cover a wide range of CCTs and CRIB. In particular, high CRI is required when providing proper color rendering in retail, hospitality and some home applications.

Conventional inorganic phosphors are typically stored in powder form. For direct on-LED applications, the process for combining the phosphor powders with LEDs involves mixing phosphor powder in the A and B parts of the silicone, dispensing the resulting slurry in an LED package, followed by temperature curing which enables crosslinking of the A and B silicone materials. Other diffuser materials are typically added to the phosphor/silicone mix, for example, to improve color over angle at the LED level.

Phosphor blends have to be adjusted for the LED-emitting wavelength, which typically has a wide range (5-20 nm) in blue LED production runs. This requires tight binning of the LEDs before and after the application of the phosphor/silicone mixture in order to achieve tight CCT and CRI tolerances at the product level. Phosphor powders in A/B silicone have a limited shelf life and need to be dispensed relatively quickly in order to prevent settlement and agglomeration of the powder in silicone as well as to avoid the onset of cross-linking. Automating the color targeting and dispensing equipment for traditional phosphors is difficult due to the abrasive nature of the phosphor materials (requires hardened steel tooling), the short life of silicone mixes, and self-absorption in the various powders. The prior art solution of binning LEDs rather than automatically adjusting the dispensed mixture is very expensive and complex.

Quantum dots (QDs) having a high photoluminescence quantum yield (PLQY) may be applicable as down-converting materials in down-converting nano-composites used in solid state lighting applications. Down-converting materials are used to improve the performance, efficiency and color choice in lighting applications, particularly light emitting diodes (LEDs). In such applications, quantum dots absorb light of a particular first (available or selected) wavelength, usually blue, and then emit light at a second wavelength, usually red or green.

QDs may contain Cadmium (Cd), the use of which is regulated in many countries, especially when used in powder form. As a safer form of delivery, QDs are typically stored in non-polar solvents like toluene and cyclohexane and can be eventually delivered from solvent into silicone mixtures that are directly applied to the emitting region of the blue LED or in the form of a remote phosphor.

Transporting QDs in solvent or uncured silicone mitigates the hazards of nano-powders; however, solvents like toluene are toxic and/or flammable and require special handling. Furthermore, transporting the QDs in silicone may limit the final silicone choice for the LED and QD composite.

Silicone paste is commonly used when applying color to injection-molded silicone parts. Silicone paste is highly viscous, typically formed from a non-crosslinking form of silicone resin (e.g., polydimethyl siloxane-based fluid), optional solvent, and optional additives, all of which are compatible with the storage and delivery of QDs. Silicone paste will not crosslink with the A and B silicones used in molding parts, so the paste can be used with any number of A/B silicones from multiple vendors. Furthermore, silicone paste has a long shelf life, and color pigment in the paste tends to stay in suspension with minimum settling or agglomeration. Injection molding machines typically have streams for the A and B silicones. Color is introduced as a paste through a third stream and mixed into the A and B silicones before the parts are formed and cured.

SUMMARY

Embodiments of the present invention include quantum dot delivery methods. In an embodiment, a method of delivering or storing a plurality of nano-particles involves providing a plurality of nano-particles. The method also involves forming a dispersion of the plurality of nano-particles in a medium for delivery or storage, wherein the medium is free of organic solvent. In another embodiment, a composition for delivery or storage of nano-particles includes the formation of a silicone paste. In this embodiment, a plurality of nano-particles is dispersed in the silicone paste.

DETAILED DESCRIPTION

Figure 1A:
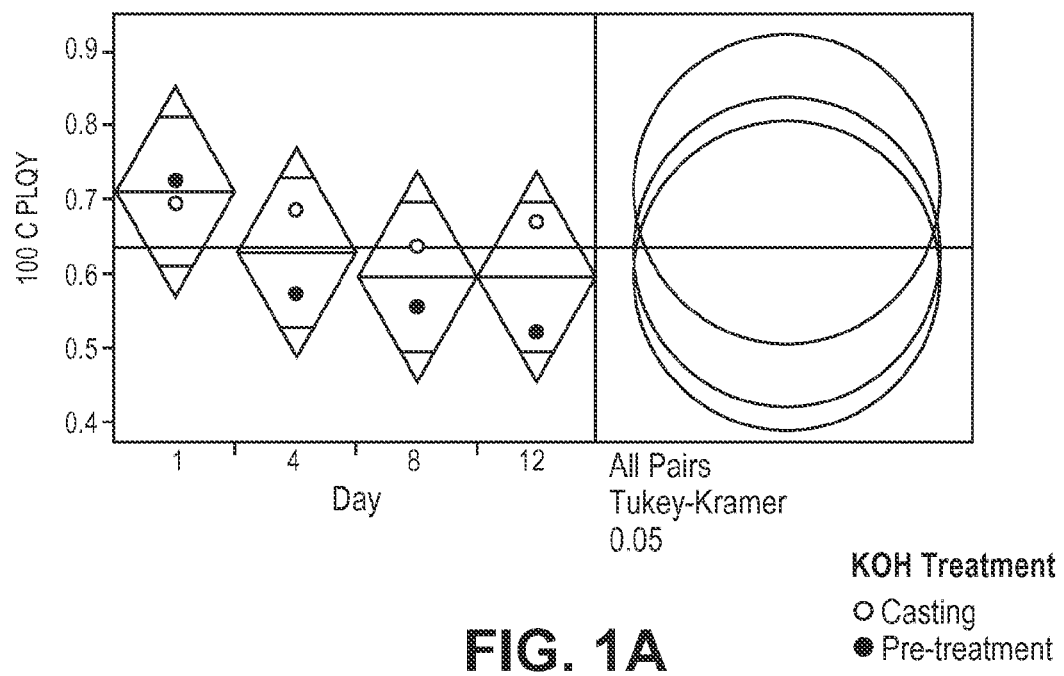
FIG. 1A is a graph showing one-way analysis of quantum dot samples over the course of twelve days for quantum dots delivered as a vinyl-containing poly(phenylmethylsiloxane) polymer solution, in accordance with an embodiment of the present invention.

Quantum dot delivery methods are described herein. In the following description, numerous specific details are set forth, such as specific quantum dot geometries and efficiencies, in order to provide a thorough understanding of embodiments of the present invention. It will be apparent to one skilled in the art that embodiments of the present invention may be practiced without these specific details. In other instances, well-known related apparatuses, such as the host of varieties of applicable light emitting diodes (LEDs), are not described in detail in order to not unnecessarily obscure embodiments of the present invention. Furthermore, it is to be understood that the various embodiments shown in the figures are illustrative representations and are not necessarily drawn to scale.

One or more embodiments described herein are directed to approaches for delivering stable quantum dot materials for processing into matrix materials without difficulty and without changing the properties of the quantum dots themselves. Several different approaches for quantum dot or nano-particle delivery are described herein.

To provide context, quantum dots are synthesized colloidally and, after purifying with excess reagents, are typically stored in an organic solvent such as toluene. Often, when quantum dots are manufactured for commercial purposes they are delivered dissolved in the organic solvent. However, delivering quantum dots in a solvent to end-users who wish to further process the quantum dots into a matrix may be problematic for several reasons. First, quantum dots often require the presence of ligands on the quantum dot surfaces for maintaining the optical properties and structural integrity of the quantum dots. However, the ligands present on the quantum dot surfaces can diffuse in a solvent and, as such, the properties of quantum dots may change over time if stored in this way, whether the storage is at a manufacturing facility or an end-user facility. Second, end-users may prefer not to handle the solvents typically used for storage of quantum dots, such as toluene, due to the significant fire and health hazards and the general trend toward reducing volatile organic compounds in industrial settings. Third, the presence of even trace amounts of a carrier solvent may negatively impact the curing properties of a final quantum dot composite, for example, if the final matrix material is a polymer. Fourth, quantum dots stored in solvent may have a short shelf life since the particles typically have a higher tendency to irreversibly agglomerate and therefore change properties over time. It is to be appreciated that, conventionally, quantum dots are typically shipped in solution (e.g., as dissolved in an organic solvent or water) or as a powder.

To address the above issues, in accordance with one or more embodiments of the present invention, alternative approaches for delivering stable quantum dot materials are described herein. Such approaches may enable further processing of the delivered quantum dot material into a final matrix material without difficulty and without changing the properties of the quantum dots themselves. In at least one such embodiment, quantum dot performance for quantum dots delivered by approaches described herein was unchanged as compared to analogous quantum dots stored in a solvent.

In a first aspect, some embodiments involve delivery methods compatible for an end-use that ultimately involves mixing quantum dots into a silicone polymer. In one such embodiment, quantum dots are delivered as dispersed in a polymer bearing the same functional groups as standard light emitting diode (LED) polymer encapsulants, enabling elimination of the use of an organic solvent as a dispersant while ensuring compatibility between the carrier and LED polymers. In another embodiment, quantum dots are delivered in one part of a two-part silicone formulation, again enabling elimination of the use of an organic solvent as a dispersant. In an embodiment, in either case, a permanent or end-user composite having a dispersion of the nano-particles or quantum dots therein may be fabricated. In another embodiment, in either case, additives to benefit the performance of quantum dots are be added to the quantum dot mixture for shipping, or at the point of mixing/curing/formation of the final end-user composite.

In an exemplary embodiment, a vinyl-terminated poly (phenylmethylsiloxane) (the most preferred PMV-9925) is used as a dispersion medium for delivering quantum dots to a final polymer composite which would comprise a vinyl-terminated poly(phenylmethylsiloxane)-QD and methyl or phenyl-based silicone mixture. In a specific embodiment, solvent was removed from quantum dots and the quantum dots (QD) were re-dispersed into PMV-9925. In a specific embodiment, a strong base (e.g., KOH) is added to the vinyl-terminated poly(phenylmethylsiloxane)-QD mix.

The vinyl-terminated poly(phenylmethylsiloxane)-QD mix containing a strong base (e.g. KOH) were then added to a phenyl-based silicone (at a preferred weight ratio of 1:5 QD mixture: silicone) The resulting mixture was cured and then tested for performance (e.g., by measurement of photoluminescent quantum yield, PLQY). The measurements were made at both room temperature and 100 degrees Celsius. The silicone/PMV samples were prepared and tested from the same PMV/QD stock solution over the course of 12 days, and no significant change in performance was observed.

FIG. 1A is a graph 100A showing one-way analysis of quantum dot samples over the course of twelve days for quantum dots delivered as a PMV-9925 solution, in accordance with an embodiment of the present invention. Referring to graph 100A, quantum dot samples were treated with base (KOH) in two manners: prior to dispersing in PMV-9925 and after dispersing in PMV-9925 on the day of film casting. Samples dispersed in PMV-9925 and treated with base on the day of film casting show no significant change in performance at 100 degrees Celsius.

Figure 1B:
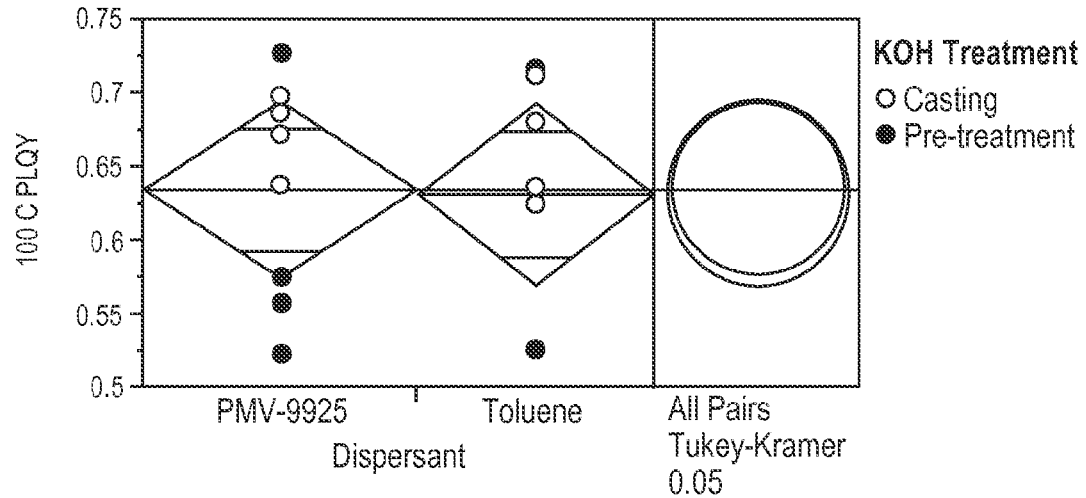
FIG. 1B is a graph showing one-way analysis of quantum dot samples dispersed in two different media: a solvent (toluene) and a vinyl-containing poly(phenylmethylsiloxane) polymer (PMV-9925), in accordance with an embodiment of the present invention.

FIG. 1B is a graph 100B showing one-way analysis of quantum dot samples dispersed in two different media: a solvent (toluene) and a polymer (PMV-9925), in accordance with an embodiment of the present invention. Referring to graph 100B, there is no significant different between the two media in relationship to their performance at 100 degrees Celsius. Thus, a performance comparison between quantum dots delivered in solvent (e.g., toluene in this case) and quantum dots delivered in PMV exhibit no statistical difference in PLQY.

In a second aspect, other embodiments involve drying the quantum dots for delivery. In an exemplary embodiment, a plurality of quantum dots is prepared as a powder by a freeze-drying process, also known as lyophilization, which involves removal of an organic solvent by applying vacuum to a solid state dispersion of quantum dots. In one such embodiment, the solid state dispersion is obtained by freezing to a temperature below the melting point of the solvent. In another exemplary embodiment, a plurality of quantum dots is prepared as a powder by removal of a solvent from a quantum dot dispersion using a rotary evaporator or a distillation apparatus followed by complete removal of any residual solvent retained in the solid mass of quantum dot particles. In one such embodiment, the residual solvent is removed by purging using an inert gas such as nitrogen ($N_2$) while the quantum dot particles are exposed to temperatures approximately in the range of 60 to 150 degrees Celsius. In an embodiment, whether dried by lyophilization or by purging with an inert gas, additives to benefit the performance of the quantum dots can be added to the quantum dot mixture for shipping, or at the point of mixing/curing/formation of the final end-user composite (which may include a dispersion of the nano-particles or quantum dots therein). It is to be appreciated that other drying approaches may also be used to prepare quantum dots for delivery.

Figure 2A:
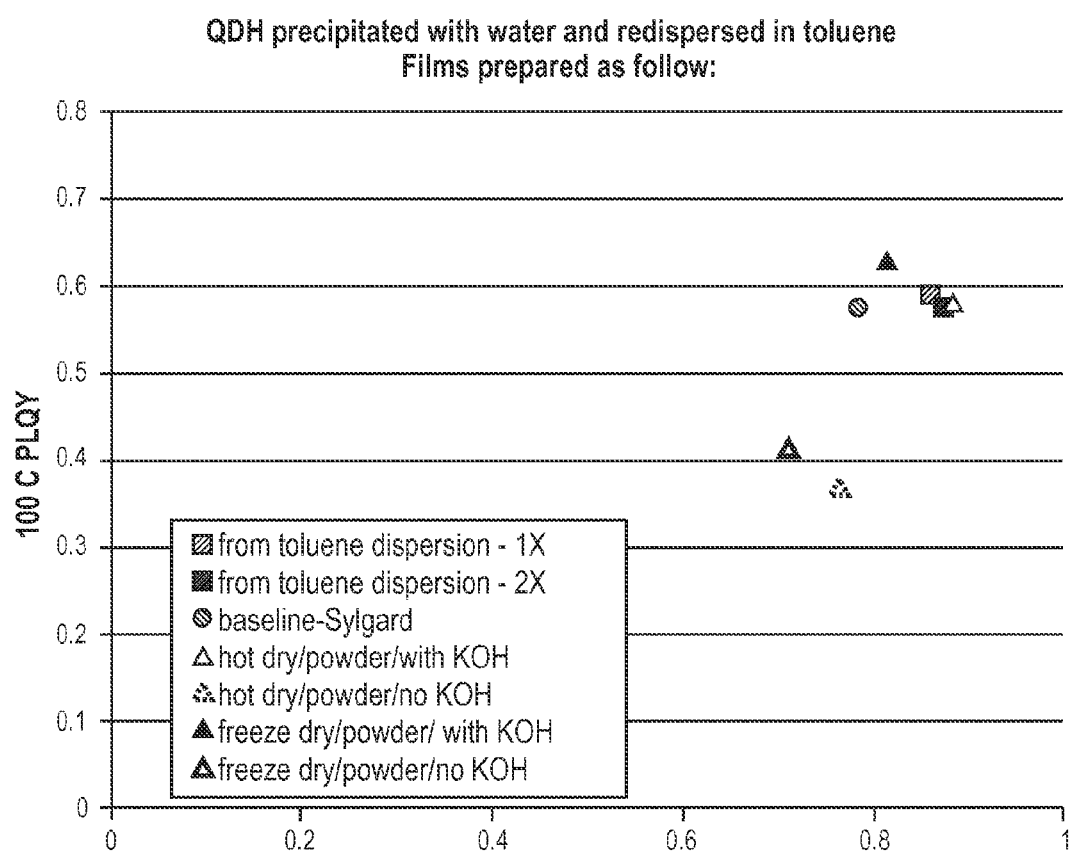
FIG. 2A is a plot of PLQY at 100 degrees Celsius versus room temperature showing luminescent nano-composite performance of films including quantum dots, in accordance with an embodiment of the present invention.

In accordance with an exemplary embodiment, FIG. 2A is a plot 200A of PLQY at 100 degrees Celsius versus room temperature showing luminescent nano-composite performance of films including quantum dots. Referring to plot 200A, films were prepared with light emitting diode (LED)-grade silicones to which quantum dot (QD) particles were incorporated by mixing with a toluene dispersion of the QD, QDs dried with heat, and QDs dried at low temperatures. Samples prepared from particles in toluene and particles which were dried in two different ways performed comparably. Any difference in performance observed here may arise from using a base (e.g., KOH in this case) as an additive to boost the photoluminescence quantum yield (PLQY), and not from the drying protocol. It is to be appreciated that based addition other than KOH may be used to boost PLQY.

Figure 2B:
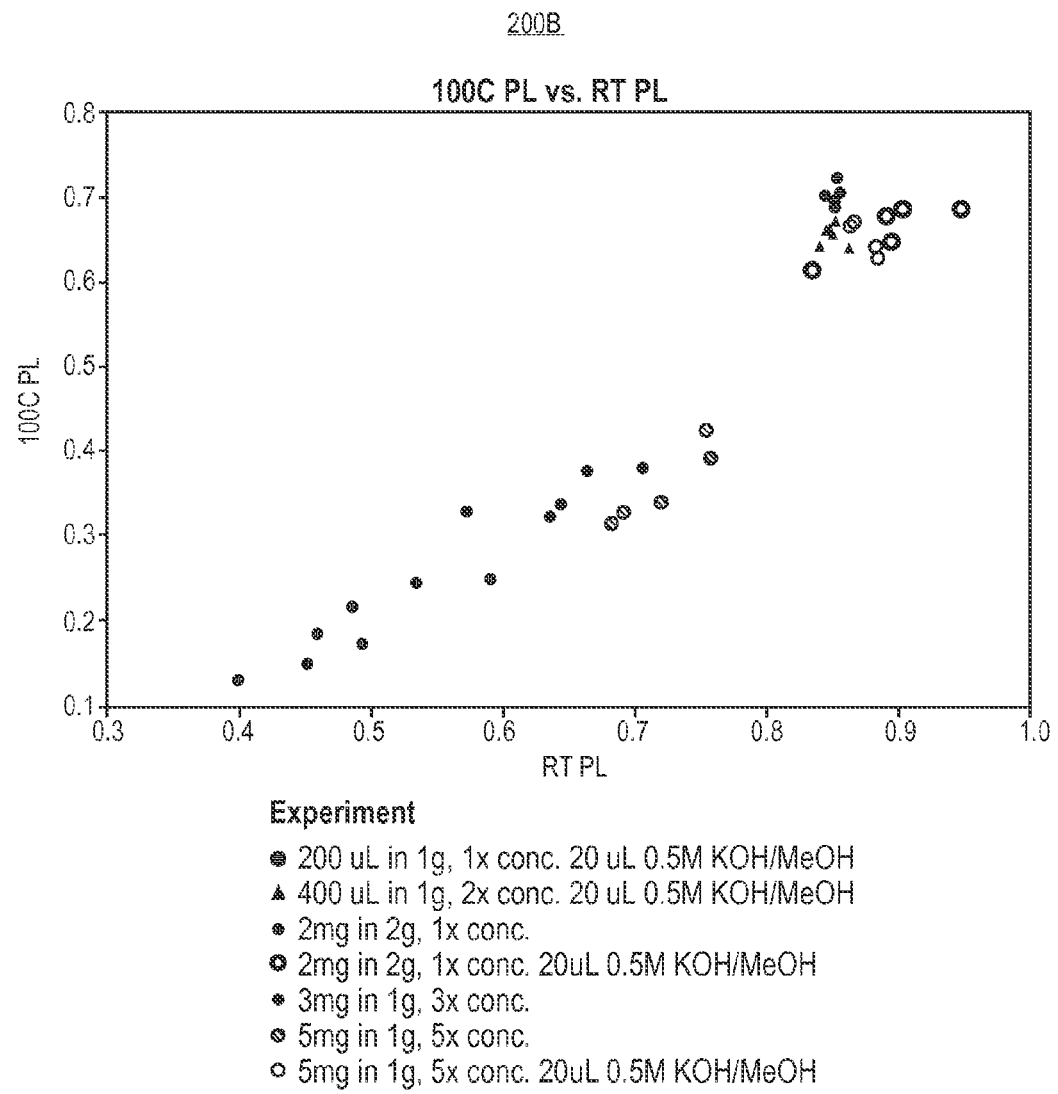
FIG. 2B is a plot of PLQY at 100 degrees Celsius versus room temperature showing luminescent nano-composite performance of films including quantum dots, in accordance with an embodiment of the present invention.

In accordance with another exemplary embodiment, FIG. 2B is a plot 200B of PLQY at 100 degrees Celsius versus room temperature showing luminescent nano-composite performance of films including quantum dots. Referring to plot 200B, luminescent nano-composite performance is provided for films prepared with LED grade silicones to which QD particles (open dots) were incorporated by mixing with a toluene dispersion of the QDs or with freeze-dried QDs at different concentrations, along with a base. The solid dots represent performance of nano-composites prepared with freeze-dried particles but to which KOH was not added. A very similar trend is observed for films prepared with particles from toluene dispersions. It is to be appreciated that based addition other than KOH may be used to boost PLQY.

Figure 3:
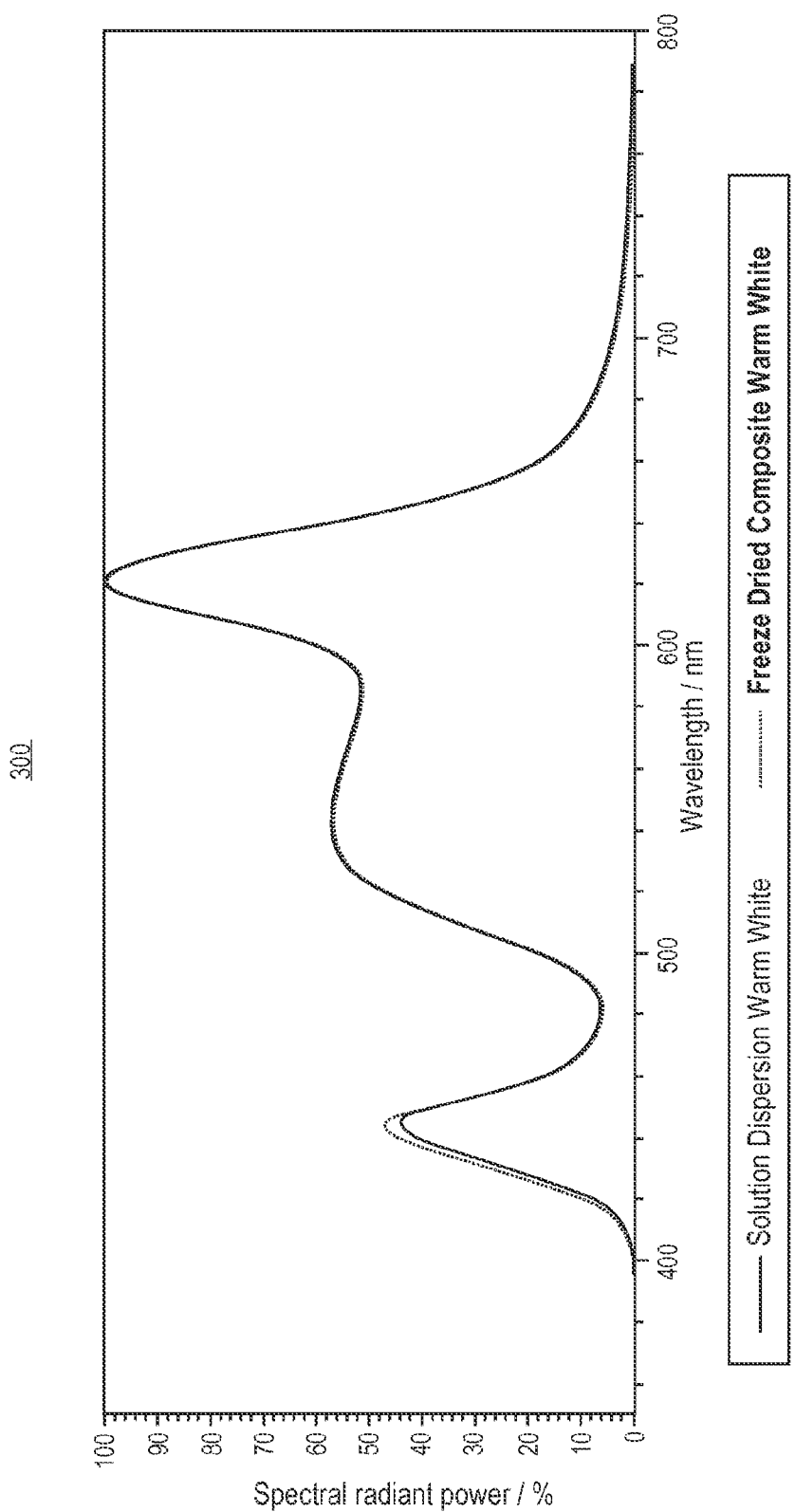
FIG. 3 is a plot of spectral radiant power (%) as a function of wavelength (nm) comparing performance of freeze-dried quantum dot heterostructures (QDH) along with solution dispersion QDH in the fabrication of a warm white phosphor film, in accordance with an embodiment of the present invention.
Figure 4:
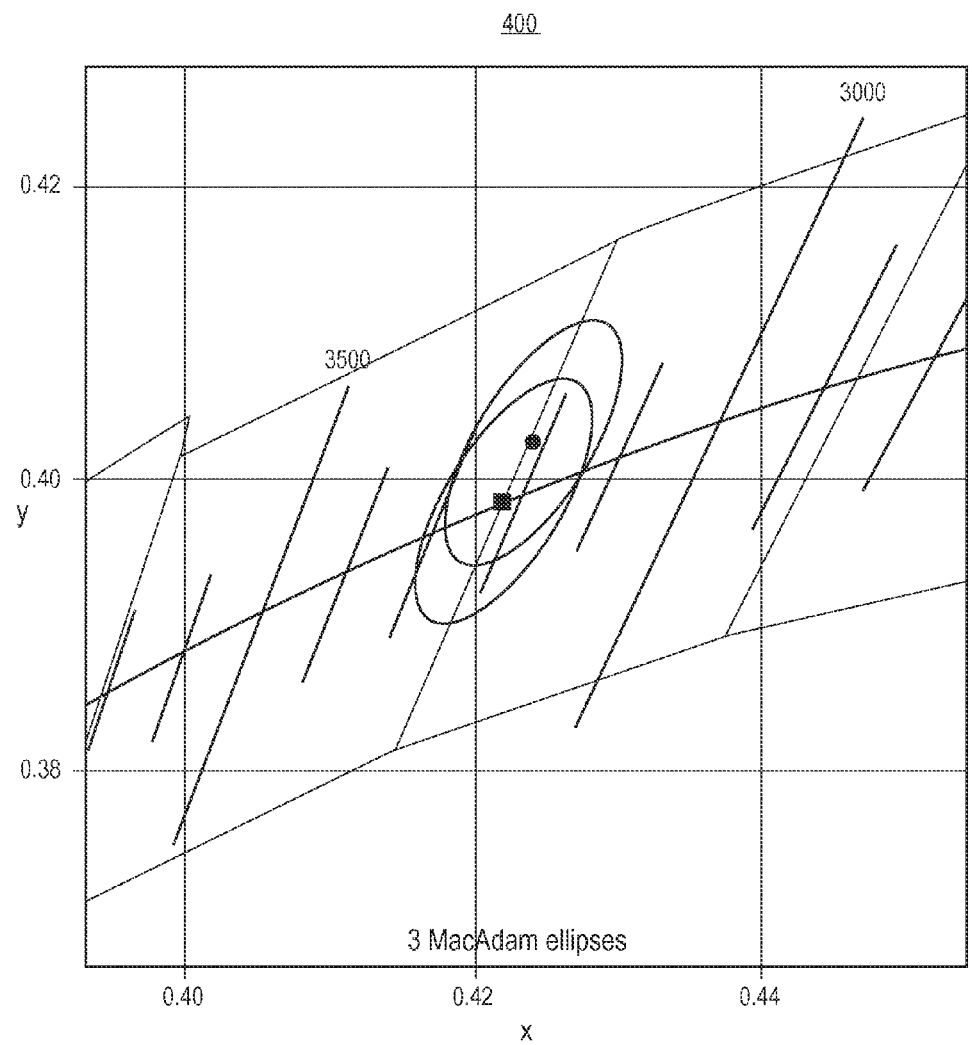
FIG. 4 is a CIE 1931 plot of freeze-dried warm white film (square) compared to solution dispersion warm white film (circle), in accordance with an embodiment of the present invention.

In accordance with another exemplary embodiment, FIG. 3 is a plot 300 of spectral radiant power (%) as a function of wavelength (nm) comparing performance of freeze-dried quantum dot heterostructures (QDH) along with solution dispersion QDH in the fabrication of a warm white phosphor film. Referring to plot 300, the freeze-dried approach maintains the same color quality and color rendering as compared to the solution dispersion method. Plot 300 also reveals that the freeze-dried nano-powder and the green phosphor powder do not aggregate together in the matrix that would otherwise be detrimental to performance. In accordance with another exemplary embodiment, FIG. 4 is a CIE 1931 plot 400 of freeze-dried warm white film (square) compared to solution dispersion warm white film (circle). Referring to plot 400, both approaches provide results that are within a 3-step MacAdam ellipse.

In a third aspect, quantum dots (QDs) are stored and dispensed on LEDs or remote phosphor films using automated equipment. In one embodiment, QDs are transferred from a solvent to a medium comprising silicone paste. The QDs may be either single wavelength quantum dots or blends of wavelengths. The medium optionally contains additives such as those commonly used with QDs for on-chip LED applications. The silicon paste is used to store and transport the QDs, for example, to mitigate the issue of directly handling Cadmium (Cd)-containing powders or solvents, and does not limit the choice of silicones used for to form the LED composite. The silicone paste is designed according to one embodiment to work with A/B silicones from any vendor and has a long shelf life. Furthermore, the paste is not corrosive, enabling the use of regular (vs. hardened) steel tooling.

While the above discussion relates to Quantum dots (QDs) being stored and dispensed on LEDs and/or remote phosphor films, it is appreciated that QDs, including Cadmium (Cd)-free QDs, can also be used in injection molding of a number of commercial silicone products that use color. When the QDs are illuminated with blue light or UV light they emit colors that can cover the entire visible spectral range and infrared ranges. For example, it is contemplated that QDs may be used in marking or identifying objects, and creating aesthetically pleasing silicone shapes and surfaces. Such uses may extend from medical and industrial applications to toys and housewares.

It is appreciated that silicone paste has a much higher viscosity compared to liquids. However, embodiments of the invention may also disperse in less viscous substances such as paint. One embodiment includes forming a dispersion of nano-particles, such as QDs, in a liquid such as paint, forming QD paint. QD paint can be used to paint surfaces of objects. The surfaces may then be illuminated with or by a blue or UV light source. Applications for such include architectural lighting, emergency lights, pathways, marking, etc.

In one embodiment, a dispensing machine dispenses QD pastes of various wavelengths, and mixes the pastes with A/B silicone to create silicone pastes with QDs dispersed therein. In an embodiment, the dispensing machine dispenses the silicone paste automatically directly on LEDs or the pastes may be used to make remote phosphor film. Optionally, the dispensing machine is capable of temperature curing the silicone pastes. In one embodiment, the dispensing machine may be integrated with in-line test equipment for targeting color. For example, the dispensing machine may, in one embodiment, target color based on blue LED wavelengths and desired CCT and CRI for a finished white emitting product. Such embodiments have several advantages, including minimizing binning, alleviating handling issues associated with Cd materials, and the ability to handle high volume production.

Figure 16:
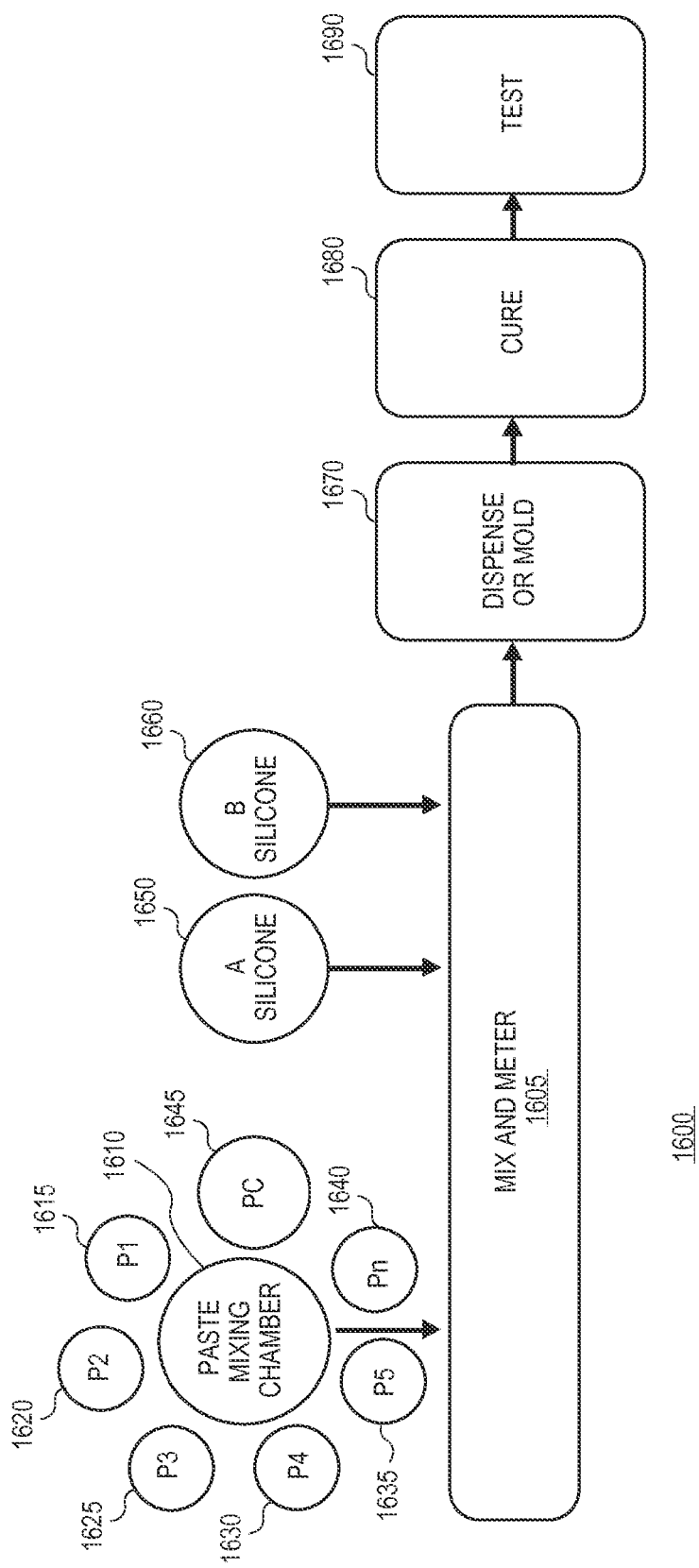
FIG. 16 illustrates an embodiment of the invention.

FIG. 16 provides a block diagram of a tool 1600 for fabricating an LED with a composite layer including QDs, wherein the QDs are delivered in a silicone paste to the tool, according to one embodiment of the invention. One or more of silicone paste reservoirs P1-Pn (1615-1635) contain QDs of different wavelengths and mixes according to the fabrication job being performed. Additionally silicone paste reservoir PC at 1640 maintains a supply of clear silicone paste that may be used as needed to add to a silicone paste mixture or flush the system. The reservoirs supply paste to paste-mixing chamber 1610, where, the various pastes supplied to the chamber are mixed together. The pastes are mixed together in the correct ratios to achieve the color requirements of the final LED application, for example specific color coordinates, color temperature, and/or color rendering index.

A silicone mixing and metering device 1605 receives the QD silicone paste from paste mixing chamber 1610, and further receives A and B silicone from A silicone reservoir 1650 and B silicone reservoir 1660, respectively. The mixing and metering device 1605 receives, measures, and mixes the QD silicone paste with the A and B silicones to form a silicone polymer composite. The composite is then provided from device 1605 to a dispensing tool 1670, wherein the composite can be dispensed, or provided to a molding tool for application on an LED device. At station 1680, a mold of an LED device, including the composite created at tool 1670, may be cured. In one embodiment, the LED device may be tested at tool 1690. For example, the LED's performance may be measured for one or more of color temperature, CRI, color coordinates, optical flux density, and lighting efficacy, etc.

According to the third aspect, one embodiment of the invention involves a method of delivering or storing nano-particles by forming a dispersion of the nano-particles in a silicone paste for delivery or storage, with or without organic solvent. In one embodiment, the method further comprises, subsequent to forming the dispersion of the nano-particles in the silicone paste, forming a silicone polymer composition from the dispersion of nano-particles and the silicone paste. In one embodiment, the nano-particles are quantum dots. In one embodiment, the dispersion of quantum dots at least maintains the photoluminescent quantum yield (PLQY) of the quantum dots. In one embodiment, the method involves adding an additive to the dispersion of quantum dots in the silicone paste. The additive may be used to improve the performance of the quantum dots. For example, the additive may be a photoluminescent quantum yield (PLQY) boosting agent. In one embodiment, the additive is added during shipping or storage of the dispersion of the quantum dots in the silicone paste. In one embodiment, the additive is added during mixing, curing or formation of a composite from the dispersion of the quantum dots in the silicone paste.

Figure 5:
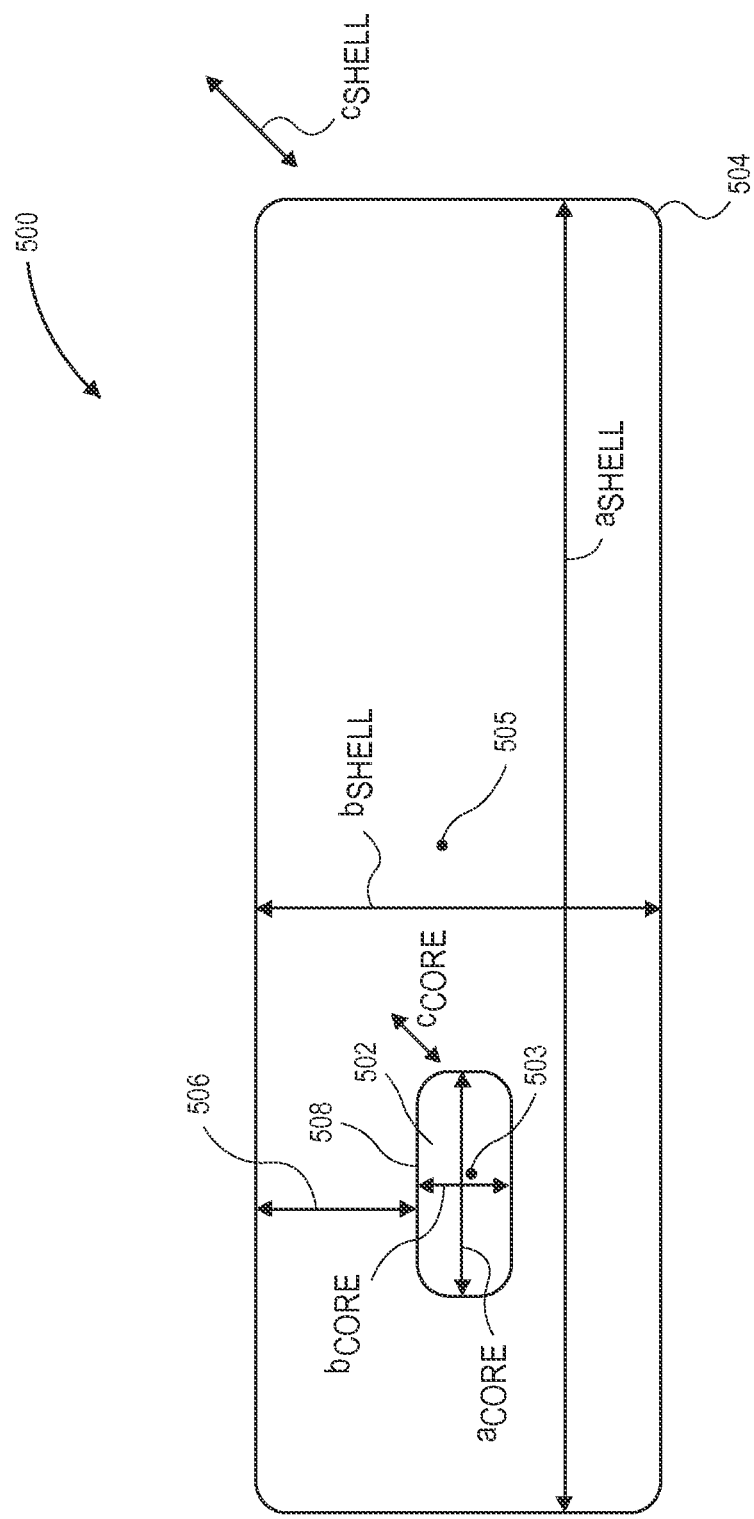
FIG. 5 illustrates a schematic of a cross-sectional view of a quantum dot suitable for delivery by approaches described herein, in accordance with an embodiment of the present invention.

In another aspect, the above described delivery approaches can be used to deliver nano-particles, such as hetero-structure-based quantum dots. Such hetero-structures may have specific geometries suitable for performance optimization. In an example, several factors may be intertwined for establishing an optimized geometry for a quantum dot having a nano-crystalline core and nano-crystalline shell pairing. As a reference, FIG. 5 illustrates a schematic of a cross-sectional view of a quantum dot suitable for delivery by approaches described herein, in accordance with an embodiment of the present invention. Referring to FIG. 5, a semiconductor structure (e.g., a quantum dot structure) 500 includes a nano-crystalline core 502 surrounded by a nano-crystalline shell 504. The nano-crystalline core 502 has a length axis (aCORE), a width axis (bCORE) and a depth axis (cCORE), the depth axis provided into and out of the plane shown in FIG. 5. Likewise, the nano-crystalline shell 504 has a length axis (aSHELL), a width axis (bSHELL) and a depth axis (cSHELL), the depth axis provided into and out of the plane shown in FIG. 5. The nano-crystalline core 502 has a center 503 and the nano-crystalline shell 504 has a center 505. The nano-crystalline shell 504 surrounds the nano-crystalline core 502 in the b-axis direction by an amount 506, as is also depicted in FIG. 5.

The following are attributes of a quantum dot that may be tuned for optimization, with reference to the parameters provided in FIG. 5, in accordance with embodiments of the present invention. Nano-crystalline core 502 diameter (a, b or c) and aspect ratio (e.g., a/b) can be controlled for rough tuning for emission wavelength (a higher value for either providing increasingly red emission). A smaller overall nano-crystalline core provides a greater surface to volume ratio. The width of the nano-crystalline shell along 506 may be tuned for yield optimization and quantum confinement providing approaches to control red-shifting and mitigation of surface effects. However, strain considerations must be accounted for when optimizing the value of thickness 506. The length (aSHELL) of the shell is tunable to provide longer radiative decay times as well as increased light absorption. The overall aspect ratio of the structure 500 (e.g., the greater of aSHELL/bSHELL and aSHELL/cSHELL) may be tuned to directly impact PLQY. Meanwhile, overall surface/volume ratio for 500 may be kept relatively smaller to provide lower surface defects, provide higher photoluminescence, and limit self-absorption. Referring again to FIG. 5, the shell/core interface 508 may be tailored to avoid dislocations and strain sites. In one such embodiment, a high quality interface is obtained by tailoring one or more of injection temperature and mixing parameters, the use of surfactants, and control of the reactivity of precursors.

In accordance with an embodiment of the present invention, a high PLQY quantum dot is based on a core/shell pairing using an anisotropic core. With reference again to FIG. 5, an anisotropic core is a core having one of the axes aCORE, bCORE or cCORE different from one or both of the remaining axes. An aspect ratio of such an anisotropic core is determined by the longest of the axes aCORE, bCORE or cCORE divided by the shortest of the axes aCORE, bCORE or cCORE to provide a number greater than 1 (an isotropic core has an aspect ratio of 1). It is to be understood that the outer surface of an anisotropic core may have rounded or curved edges (e.g., as in an ellipsoid) or may be faceted (e.g., as in a stretched or elongated tetragonal or hexagonal prism) to provide an aspect ratio of greater than 1 (note that a sphere, a tetragonal prism, and a hexagonal prism are all considered to have an aspect ratio of 1 in keeping with embodiments of the present invention).

A workable range of aspect ratio for an anisotropic nano-crystalline core for a quantum dot may be selected for maximization of PLQY. For example, a core essentially isotropic may not provide advantages for increasing PLQY, while a core with too great an aspect ratio (e.g., 2 or greater) may present challenges synthetically and geometrically when forming a surrounding shell. Furthermore, embedding the core in a shell composed of a material different than the core may also be used enhance PLQY of a resulting quantum dot.

Accordingly, in an embodiment, a semiconductor structure includes an anisotropic nano-crystalline core composed of a first semiconductor material and having an aspect ratio between, but not including, 1.0 and 2.0. The semiconductor structure also includes a nano-crystalline shell composed of a second, different, semiconductor material at least partially surrounding the anisotropic nano-crystalline core. In one such embodiment, the aspect ratio of the anisotropic nano-crystalline core is approximately in the range of 1.01-1.2 and, in a particular embodiment, is approximately in the range of 1.1-1.2. In the case of rounded edges, then, the nano-crystalline core may be substantially, but not perfectly, spherical. However, the nano-crystalline core may instead be faceted. In an embodiment, the anisotropic nano-crystalline core is disposed in an asymmetric orientation with respect to the nano-crystalline shell, as described in greater detail in the example below.

Another consideration for maximization of PLQY in a quantum dot structure is to provide an asymmetric orientation of the core within a surrounding shell. For example, referring again to FIG. 5, the center 503 of the core 502 may be misaligned with (e.g., have a different spatial point than) the center 505 of the shell 504. In an embodiment, a semiconductor structure includes an anisotropic nano-crystalline core composed of a first semiconductor material. The semiconductor structure also includes a nano-crystalline shell composed of a second, different, semiconductor material at least partially surrounding the anisotropic nano-crystalline core. The anisotropic nano-crystalline core is disposed in an asymmetric orientation with respect to the nano-crystalline shell. In one such embodiment, the nano-crystalline shell has a long axis (e.g., aSHELL), and the anisotropic nano-crystalline core is disposed off-center along the long axis. In another such embodiment, the nano-crystalline shell has a short axis (e.g., bSHELL), and the anisotropic nano-crystalline core is disposed off-center along the short axis. In yet another embodiment, however, the nano-crystalline shell has a long axis (e.g., aSHELL) and a short axis (e.g., bSHELL), and the anisotropic nano-crystalline core is disposed off-center along both the long and short axes.

With reference to the above described nano-crystalline core and nano-crystalline shell pairings, in an embodiment, the nano-crystalline shell completely surrounds the anisotropic nano-crystalline core. In an alternative embodiment, however, the nano-crystalline shell only partially surrounds the anisotropic nano-crystalline core, exposing a portion of the anisotropic nano-crystalline core, e.g., as in a tetrapod geometry or arrangement. In an embodiment, the nano-crystalline shell is an anisotropic nano-crystalline shell, such as a nano-rod, that surrounds the anisotropic nano-crystalline core at an interface between the anisotropic nano-crystalline shell and the anisotropic nano-crystalline core. The anisotropic nano-crystalline shell passivates or reduces trap states at the interface. The anisotropic nano-crystalline shell may also, or instead, deactivate trap states at the interface.

With reference again to the above described nano-crystalline core and nano-crystalline shell pairings, in an embodiment, the first and second semiconductor materials (core and shell, respectively) are each materials such as, but not limited to, Group II-VI materials, Group III-V materials, Group IV-VI materials, Group I-III-VI materials, or Group II-IV-VI materials and, in one embodiment, are monocrystalline. In one such embodiment, the first and second semiconductor materials are both Group II-VI materials, the first semiconductor material is cadmium selenide (CdSe), and the second semiconductor material is one such as, but not limited to, cadmium sulfide (CdS), zinc sulfide (ZnS), or zinc selenide (ZnSe). In an embodiment, the semiconductor structure further includes a nano-crystalline outer shell at least partially surrounding the nano-crystalline shell and, in one embodiment, the nano-crystalline outer shell completely surrounds the nano-crystalline shell. The nano-crystalline outer shell is composed of a third semiconductor material different from the first and second semiconductor materials. In a particular such embodiment, the first semiconductor material is cadmium selenide (CdSe), the second semiconductor material is cadmium sulfide (CdS), and the third semiconductor material is zinc sulfide (ZnS).

With reference again to the above described nano-crystalline core and nano-crystalline shell pairings, in an embodiment, the semiconductor structure (i.e., the core/shell pairing in total) has an aspect ratio approximately in the range of 1.5-10 and, 3-6 in a particular embodiment. In an embodiment, the nano-crystalline shell has a long axis and a short axis. The long axis has a length approximately in the range of 5-40 nanometers. The short axis has a length approximately in the range of 1-5 nanometers greater than a diameter of the anisotropic nano-crystalline core parallel with the short axis of the nano-crystalline shell. In a specific such embodiment, the anisotropic nano-crystalline core has a diameter approximately in the range of 2-5 nanometers. The thickness of the nano-crystalline shell on the anisotropic nano-crystalline core along a short axis of the nano-crystalline shell is approximately in the range of 1-5 nanometers of the second semiconductor material.

With reference again to the above described nano-crystalline core and nano-crystalline shell pairings, in an embodiment, the anisotropic nano-crystalline core and the nano-crystalline shell form a quantum dot. In one such embodiment, the quantum dot has a photoluminescence quantum yield (PLQY) of at least 90%. Emission from the quantum dot may be mostly, or entirely, from the nano-crystalline core. For example, in an embodiment, emission from the anisotropic nano-crystalline core is at least approximately 75% of the total emission from the quantum dot. An absorption spectrum and an emission spectrum of the quantum dot may be essentially non-overlapping. For example, in an embodiment, an absorbance ratio of the quantum dot based on absorbance at 400 nanometers versus absorbance at an exciton peak for the quantum dot is approximately in the range of 5-35.

In an embodiment, a quantum dot based on the above described nano-crystalline core and nano-crystalline shell pairings is a down-converting quantum dot. However, in an alternative embodiment, the quantum dot is an up-shifting quantum dot. In either case, a lighting apparatus may include a light emitting diode and a plurality of quantum dots such as those described above. The quantum dots may be applied proximal to the LED and provide down-conversion or up-shifting of light emitted from the LED. Thus, semiconductor structures according to the present invention may be advantageously used in solid state lighting. The visible spectrum includes light of different colors having wavelengths between about 380 nm and about 780 nm that are visible to the human eye. An LED will emit a UV or blue light which is down-converted (or up-shifted) by semiconductor structures described herein. Any suitable ratio of emission color from the semiconductor structures may be used in devices of the present invention. LED devices according to embodiments of the present invention may have incorporated therein sufficient quantity of semiconductor structures (e.g., quantum dots) described herein capable of down-converting any available blue light to red, green, yellow, orange, blue, indigo, violet or other color. These structures may also be used to downconvert or upconvert lower energy light (green, yellow, etc) from LED devices, as long as the excitation light produces emission from the structures.

The above described semiconductor structures, e.g., quantum dots, suitable for delivery by approaches described herein may be fabricated to further include one or more compositional transition layers between portions of the structures, e.g., between core and shell portions. Inclusion of such a transition layer may reduce or eliminate any performance inefficiency associated with otherwise abrupt junctions between the different portions of the structures. For example, the inclusion of a compositional transition layer may be used to suppress Auger recombination within a quantum dot structure. Auger recombination events translate to energy from one exciton being non-radiatively transferred to another charge carrier. Such recombination in quantum dots typically occurs on sub-nanosecond time scales such that a very short multi-exciton lifetime indicates non-radiative recombination, while higher nanosecond bi-exciton lifetimes indicate radiative recombination. A radiative bi-exciton has a lifetime approximately 2-4 times shorter than radiative single exciton.

More specifically, as is described in greater detail below in association with FIGS. 6-8, an optimal particle (e.g., quantum dot structure) may have one or more of a high aspect ratio, a large volume relative to other quantum dot hetero-structures, and graded or alloyed transitions between different semiconductor materials. The graded or alloyed transitions can be used to render a compositional and structural transition from one component (such as a quantum dot core) to another component (such as a quantum dot shell) a smooth function rather than a step function. In one embodiment, the terms "graded," "gradient," or "grading" are used to convey gradual transitioning from one semiconductor to another. In one embodiment, the terms "alloy," "alloyed," or "alloying" are used to convey an entire volume having a fixed intermediate composition. In more specific embodiments, core or seed volume is maximized relative to shell volume for a given emission color. A graded or alloyed core/shell transition layer may be included between the two volumes.

Figure 6:
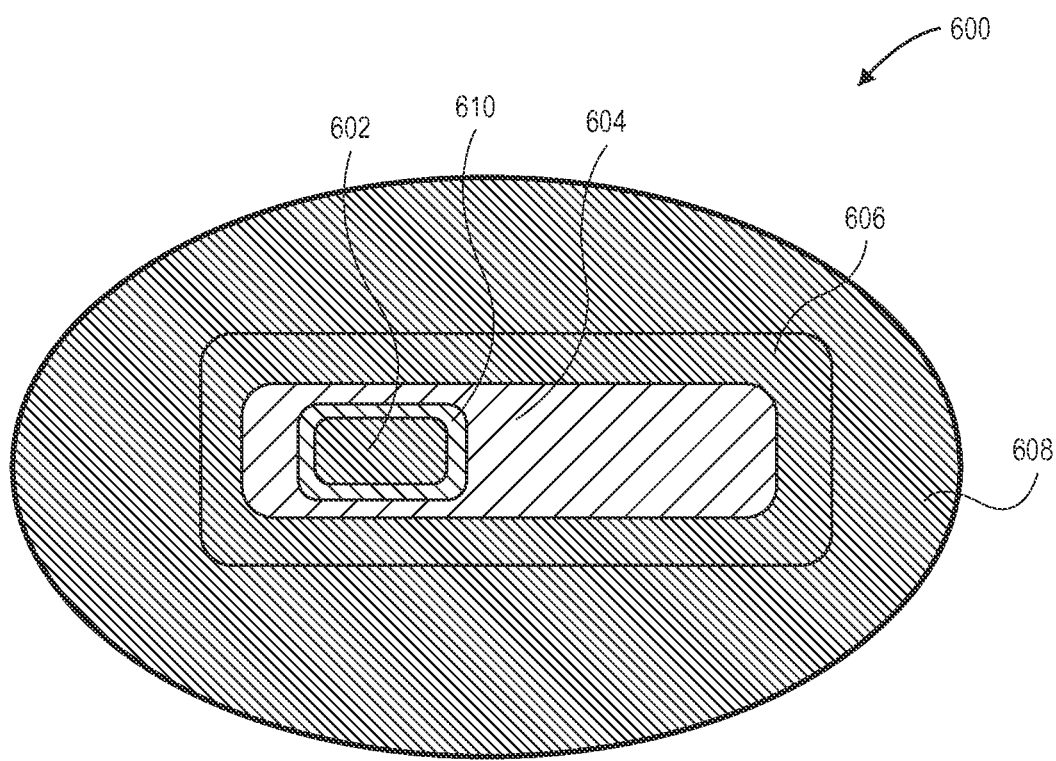
FIG. 6 illustrates a cross-sectional view of a semiconductor structure having a nano-crystalline core and nano-crystalline shell pairing with one compositional transition layer, in accordance with an embodiment of the present invention.

In a first example, FIG. 6 illustrates a cross-sectional view of a semiconductor structure having a nano-crystalline core and nano-crystalline shell pairing with one compositional transition layer, in accordance with an embodiment of the present invention.

Referring to FIG. 6, a semiconductor structure 600 includes a nano-crystalline core 602 composed of a first semiconductor material. A nano-crystalline shell 604 composed of a second, different, semiconductor material at least partially surrounds the nano-crystalline core 602. A compositional transition layer 610 is disposed between, and in contact with, the nano-crystalline core 602 and nano-crystalline shell 604. The compositional transition layer 610 has a composition intermediate to the first and second semiconductor materials.

In an embodiment, the compositional transition layer 610 is an alloyed layer composed of a mixture of the first and second semiconductor materials. In another embodiment, the compositional transition layer 610 is a graded layer composed of a compositional gradient of the first semiconductor material proximate to the nano-crystalline core 602 through to the second semiconductor material proximate to the nano-crystalline shell 604. In either case, in a specific embodiment, the compositional transition layer 610 has a thickness approximately in the range of 1.5-2 monolayers.

Exemplary embodiments include a structure 600 where the first semiconductor material is cadmium selenide (CdSe), the second semiconductor material is cadmium sulfide (CdS), and the compositional transition layer 610 is composed of $CdSe_xS_y$, where $0<x<1$ and $0<y<1$, or where the first semiconductor material is cadmium selenide (CdSe), the second semiconductor material is zinc selenide (ZnSe), and the compositional transition layer 610 is composed of $Cd_xZn_ySe$, where $0<x<1$ and $0<y<1$.

In accordance with an embodiment of the present invention, the compositional transition layer 610 passivates or reduces trap states where the nano-crystalline shell 604 surrounds the nano-crystalline core 602. Exemplary embodiments of core and/or shell parameters include a structure 600 where the nano-crystalline core 602 is an anisotropic nano-crystalline core having an aspect ratio between, but not including, 1.0 and 2.0 (in a specific embodiment, approximately in the range of 1.01-1.2), and the nano-crystalline shell is an anisotropic nano-crystalline shell having an aspect ratio approximately in the range of 4-6.

In an embodiment, the nano-crystalline shell 604 completely surrounds the nano-crystalline core 602, as depicted in FIG. 6. In an alternative embodiment, however, the nano-crystalline shell 604 only partially surrounds the nano-crystalline core 602, exposing a portion of the nano-crystalline core 602. Furthermore, in either case, the nano-crystalline core 602 may be disposed in an asymmetric orientation with respect to the nano-crystalline shell 604. In one or more embodiments, semiconductor structures such as 600 are fabricated to further include a nano-crystalline outer shell 606 at least partially surrounding the nano-crystalline shell 604. The nano-crystalline outer shell 606 may be composed of a third semiconductor material different from the first and second semiconductor materials, i.e., different from the materials of the core 602 and shell 604. The nano-crystalline outer shell 606 may completely surround the nano-crystalline shell 604 or may only partially surround the nano-crystalline shell 604, exposing a portion of the nano-crystalline shell 604.

For embodiments including a nano-crystalline outer shell, an additional compositional transition layer may be included. Thus, in a second example, FIG. 7 illustrates a cross-sectional view of a semiconductor structure having a nano-crystalline core/nano-crystalline shell/nano-crystalline outer shell combination with two compositional transition layers, in accordance with an embodiment of the present invention.

Figure 7:
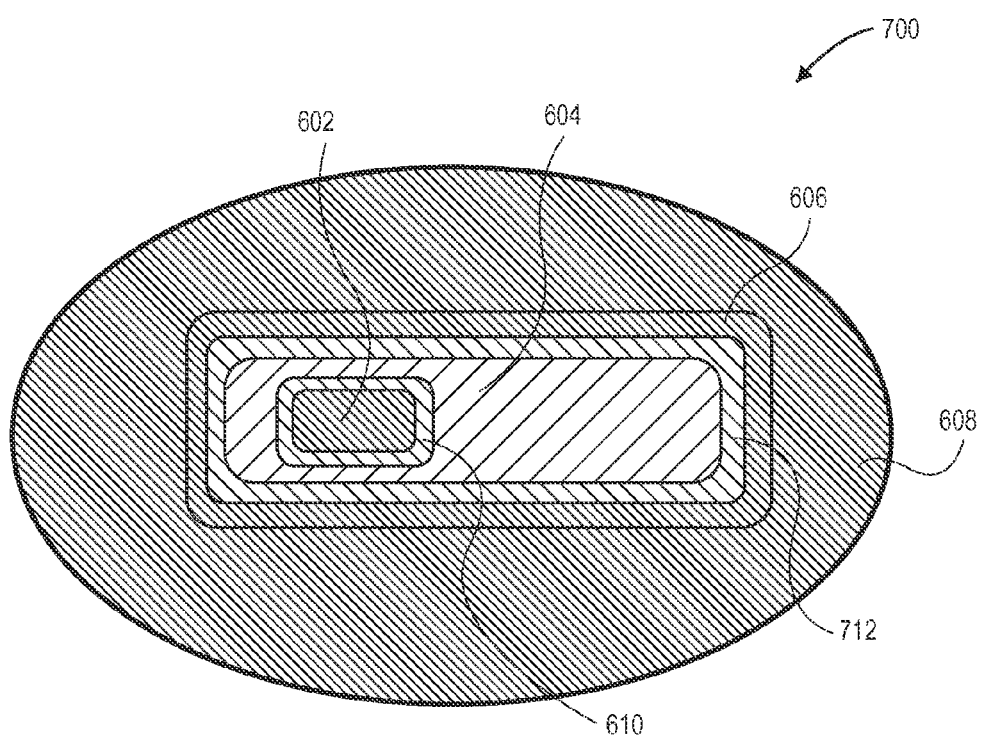
FIG. 7 illustrates a cross-sectional view of a semiconductor structure having a nano-crystalline core/nano-crystalline shell/nano-crystalline outer shell combination with two compositional transition layers, in accordance with an embodiment of the present invention.

Referring to FIG. 7, a semiconductor structure 700 includes the nano-crystalline core 602, nano-crystalline shell 604, nano-crystalline outer shell 606 and compositional transition layer 610 of structure 600. However, in addition, semiconductor structure 700 includes a second compositional transition layer 712 disposed between, and in contact with, the nano-crystalline shell 604 and the nano-crystalline outer shell 606. The second compositional transition layer 712 has a composition intermediate to the second and third semiconductor materials, i.e., intermediate to the semiconductor materials of the shell 604 and outer shell 606.

In an embodiment, the second compositional transition layer 712 is an alloyed layer composed of a mixture of the second and third semiconductor materials. In another embodiment, the second compositional transition layer 712 is a graded layer composed of a compositional gradient of the second semiconductor material proximate to the nano-crystalline shell 604 through to the third semiconductor material proximate to the nano-crystalline outer shell 606. In either case, in a specific embodiment, the second compositional transition layer 712 has a thickness approximately in the range of 1.5-2 monolayers. Exemplary embodiments include a structure 700 where the first semiconductor material is cadmium selenide (CdSe), the second semiconductor material is cadmium sulfide (CdS), the third semiconductor material is zinc sulfide (ZnS), and the second compositional transition layer 1412 is composed of $Cd_xZn_yS$, where $0<x<1$ and $0<y<1$, or the first semiconductor material is cadmium selenide (CdSe), the second semiconductor material is zinc selenide (ZnSe), the third semiconductor material is zinc sulfide (ZnS), and the second compositional transition layer 1412 is composed of $ZnSe_xS_y$, where $0<x<1$ and $0<y<1$. In accordance with an embodiment of the present invention, the second compositional transition layer 712 passivates or reduces trap states where the nano-crystalline outer shell 606 surrounds the nano-crystalline shell 604.

For other embodiments including a nano-crystalline outer shell, an outer compositional transition layer may be included without including an inner compositional transition layer. Thus, in a third example, FIG. 8 illustrates a cross-sectional view of a semiconductor structure having a nano-crystalline core/nano-crystalline shell/nano-crystalline outer shell combination with one compositional transition layer, in accordance with an embodiment of the present invention.

Figure 8:
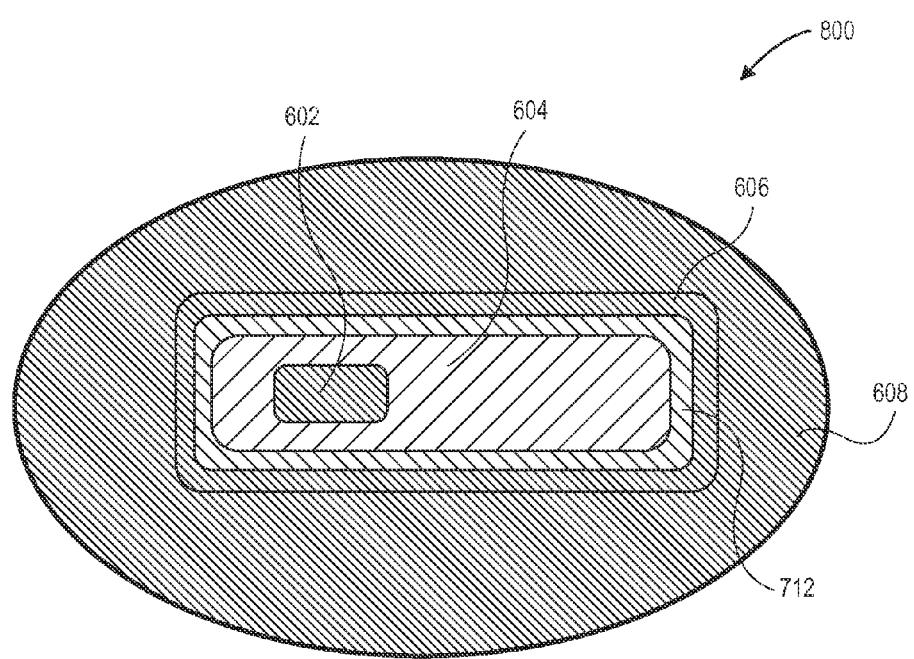
FIG. 8 illustrates a cross-sectional view of a semiconductor structure having a nano-crystalline core/nano-crystalline shell/nano-crystalline outer shell combination with one compositional transition layer, in accordance with an embodiment of the present invention.

Referring to FIG. 8, a semiconductor structure 800 includes the nano-crystalline core 602, nano-crystalline shell 604, and nano-crystalline outer shell 606 of structure 600. In addition, the semiconductor structure 800 includes the compositional transition layer 712 of structure 700 disposed between, and in contact with, the nano-crystalline shell 604 and the nano-crystalline outer shell 606. However, structure 800 does not include the compositional transition layer 610 of structure 600, i.e., there is no compositional transition layer between the core 602 and shell 604.

Referring to FIGS. 5-8, and as depicted in FIGS. 6-8, the structures 500, 600, 700 and 800 may further include an insulator coating (e.g., shown as 608 in FIGS. 6-8) surrounding and encapsulating the nano-crystalline core/nano-crystalline shell pairing or nano-crystalline core/nano-crystalline shell/nano-crystalline outer shell combination. In one such embodiment, the insulator coating is composed of an amorphous material such as, but not limited to, silica ($SiO_x$), titanium oxide ($TiO_x$), zirconium oxide ($ZrO_x$), alumina ($AlO_x$), or hafnia ($HfO_x$). In an embodiment, insulator-coated structures based on structures 500, 600, 700 and 800 are quantum dot structures. For example, structures 500, 600, 700 and 800 may be used as a down-converting quantum dot or an up-shifting quantum dot.

Figure 9:
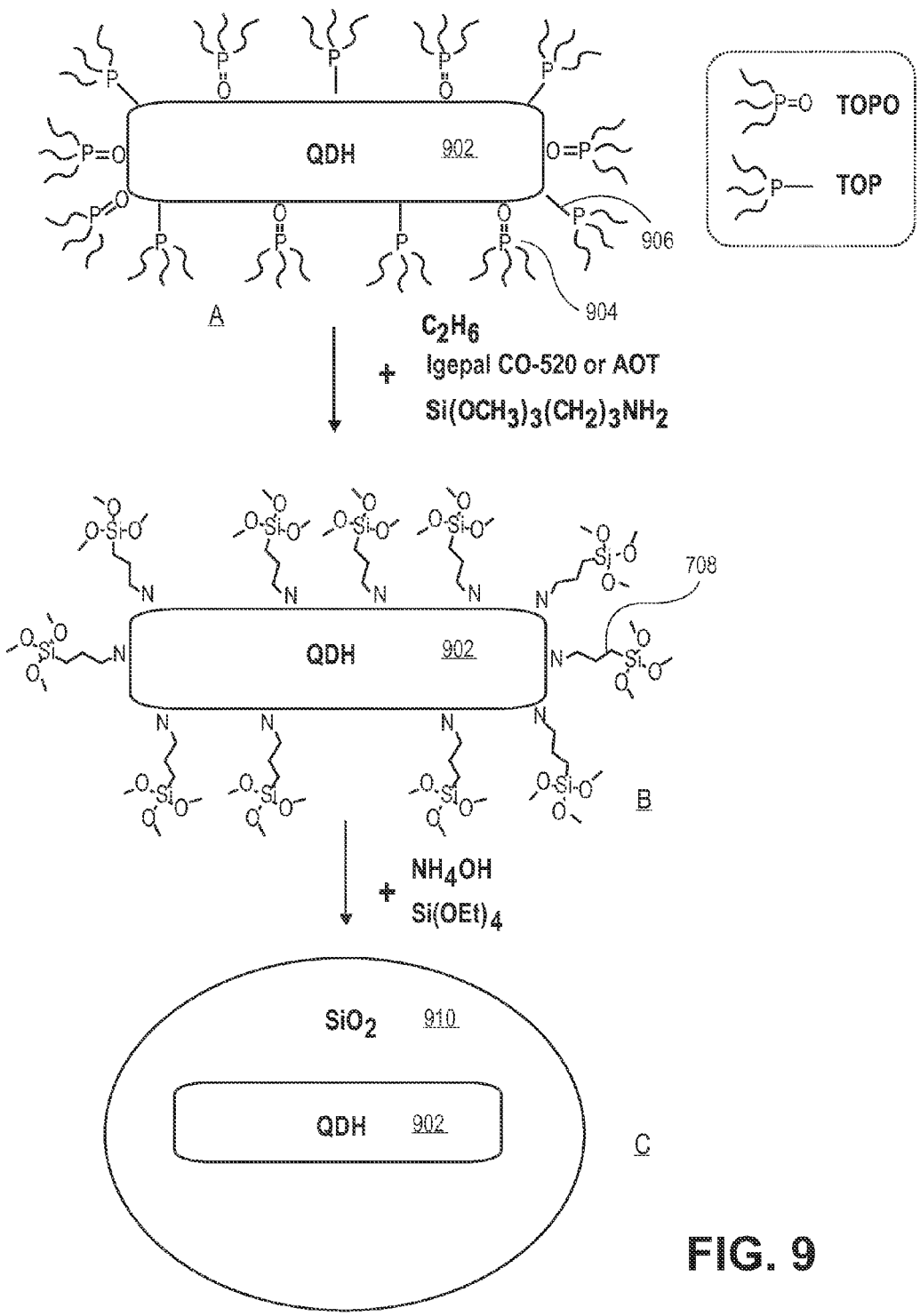
FIG. 9 illustrates operations in a reverse micelle approach to coating a semiconductor structure, in accordance with an embodiment of the present invention.

The above described insulator coating may be formed to encapsulate a quantum dot using a reverse micelle process. For example, FIG. 9 illustrates operations in a reverse micelle approach to coating a semiconductor structure, in accordance with an embodiment of the present invention. Referring to part A of FIG. 9, a quantum dot hetero-structure (QDH) 902 (e.g., a nano-crystalline core/shell pairing) has attached thereto a plurality of TOPO ligands 904 and TOP ligands 906. Referring to part B, the plurality of TOPO ligands 904 and TOP ligands 906 are exchanged with a plurality of $Si(OCH_3)_3(CH_2)_3NH_2$ ligands 908. The structure of part B is then reacted with TEOS ($Si(OEt)_4$) and ammonium hydroxide ($NH_4OH$) to form a silica coating 910 surrounding the QDH 902, as depicted in part C of FIG. 9.

In another aspect, nano-particles or quantum dots are delivered by approaches described herein for ultimate use in application for a lighting device, e.g., to provide a layer having a dispersion of semiconductor structures therein for inclusion in the lighting device. In one embodiment, the dispersion of semiconductor structures is a dispersion of quantum dots such as those described above in association with FIGS. 5-9.

Figure 10:
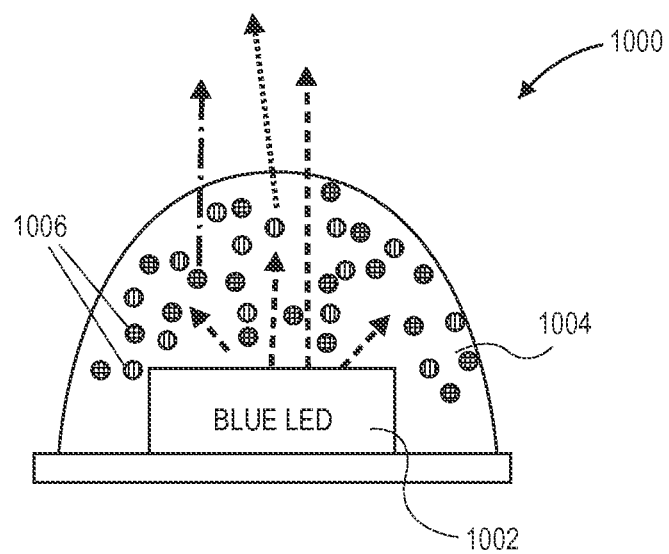
FIG. 10 illustrates a lighting device that includes a blue LED with a layer having a composition with a dispersion of quantum dots therein, in accordance with an embodiment of the present invention.
Figure 11:
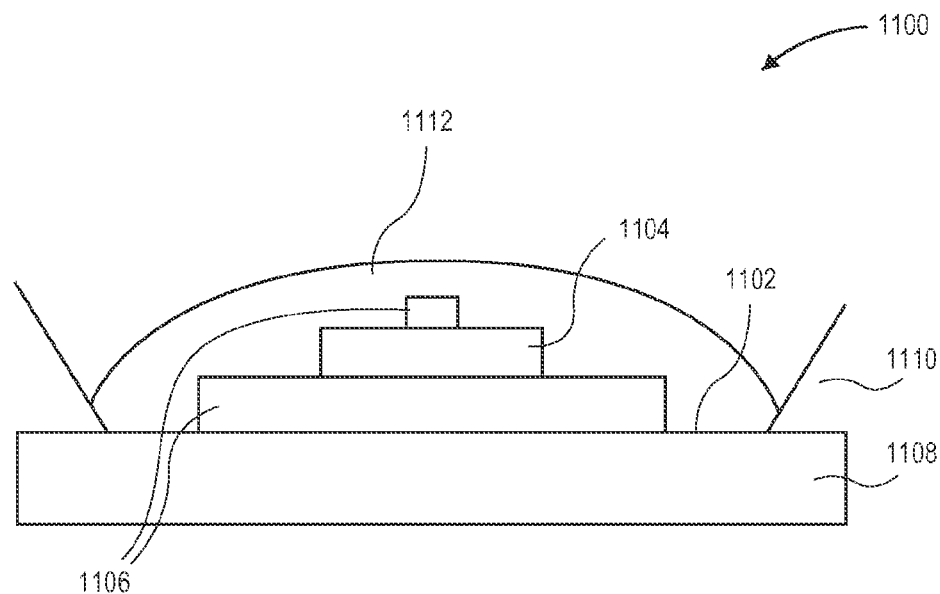
FIG. 11 illustrates a cross-sectional view of a lighting device with a layer having a composition with a dispersion of quantum dots therein, in accordance with an embodiment of the present invention.

As an example, FIG. 10 illustrates a lighting device 1000. Device 1000 has a blue LED 1002 with a layer 1004 having a dispersion of quantum dots 1006 therein, in accordance with an embodiment of the present invention. Devices 1000 may be used to produce "cold" or "warm" white light. In one embodiment, the device 1000 has little to no wasted energy since there is little to no emission in the IR regime. In a specific such embodiment, the use of a layer having a composition with a dispersion of anisotropic quantum dots therein enables greater than approximately 40% lm/W gains versus the use of conventional phosphors. Increased efficacy may thus be achieved, meaning increased luminous efficacy based on lumens (perceived light brightness) per watt electrical power. Accordingly, down converter efficiency and spectral overlap may be improved with the use of a dispersion of quantum dots to achieve efficiency gains in lighting and display. In an additional embodiment, a conventional phosphor is also included in the composition, along with the dispersion of quantum dots 1006. Different approaches may be used to provide a quantum dot layer in a lighting device. In an example, FIG. 11 illustrates a cross-sectional view of a lighting device 1100 with a layer having a composition with a dispersion of quantum dots therein, in accordance with an embodiment of the present invention. Referring to FIG. 11, a blue LED structure 1102 includes a die 1104, such as an InGaN die, and electrodes 1106. The blue LED structure 1102 is disposed on a coating or supporting surface 1108 and housed within a protective and/or reflective structure 1110. A layer 1112 is formed over the blue LED structure 1102 and within the protective and/or reflective structure 1110. The layer 1112 has a composition including a dispersion of quantum dots or a combination of a dispersion of quantum dots and conventional phosphors. Although not depicted, the protective and/or reflective structure 1110 can be extended upwards, well above the matrix layer 1112, to provide a "cup" configuration.

Figure 12:
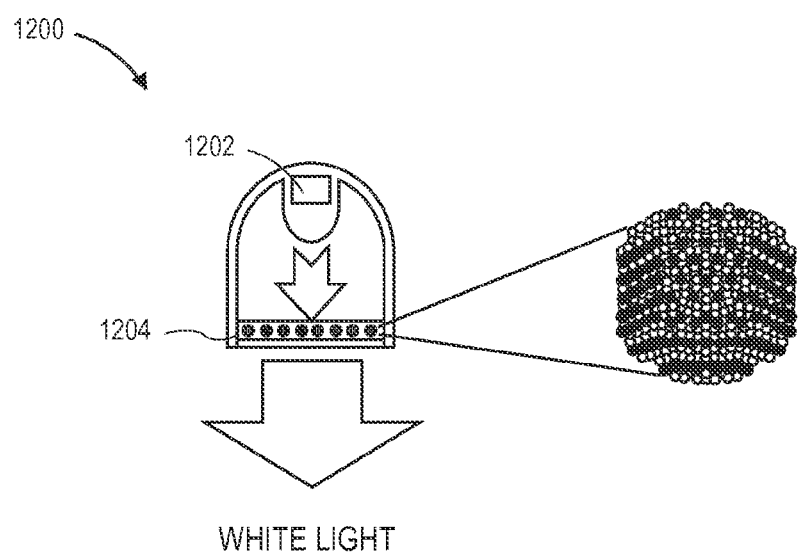
FIG. 12 illustrates a cross-sectional view of a lighting device with a layer having a composition with a dispersion of quantum dots therein, in accordance with another embodiment of the present invention.

In another example, FIG. 12 illustrates a cross-sectional view of a lighting device 1200 with a layer having a composition with a dispersion of quantum dots therein, in accordance with another embodiment of the present invention. Referring to FIG. 12, the lighting device 1200 includes a blue LED structure 1202. A quantum dot down converter screen 1204 is positioned somewhat remotely from the blue LED structure 1202. The quantum dot down converter screen 1204 includes a layer with a composition having a dispersion of quantum dots therein, e.g., of varying color, or a combination of a dispersion of quantum dots and conventional phosphors. In one embodiment, the device 1200 can be used to generate white light, as depicted in FIG. 12.

Figure 13:
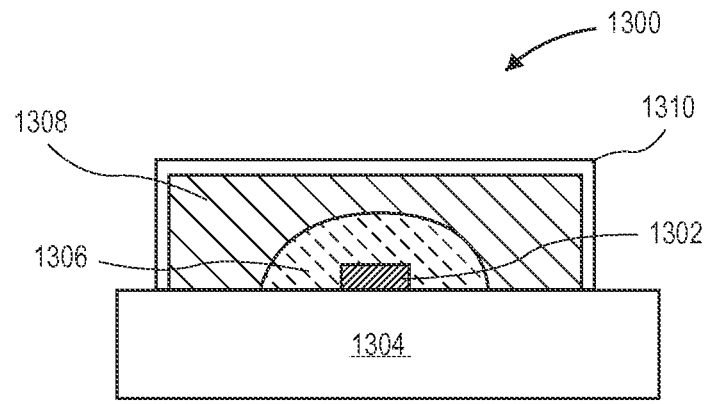
FIG. 13 illustrates a cross-sectional view of a lighting device with a layer having a composition with a dispersion of quantum dots therein, in accordance with another embodiment of the present invention.

In another example, FIG. 13 illustrates a cross-sectional view of a lighting device 1300 with a layer having a composition with a dispersion of quantum dots therein, in accordance with another embodiment of the present invention. Referring to FIG. 13, the lighting device 1300 includes a blue LED structure 1302 supported on a substrate 1304 which may house a portion of the electrical components of the blue LED structure 1302. A first conversion layer 1306 has a composition that includes a dispersion of red-light emitting anisotropic quantum dots therein. A second conversion layer 1308 has a second composition that includes a dispersion of quantum dots or green or yellow phosphors or a combination thereof (e.g., yttrium aluminum garnet, YAG phosphors) therein. Optionally, a sealing layer 1310 may be formed over the second conversion layer 1308, as depicted in FIG. 13. In one embodiment, the device 1300 can be used to generate white light.

Figure 14:
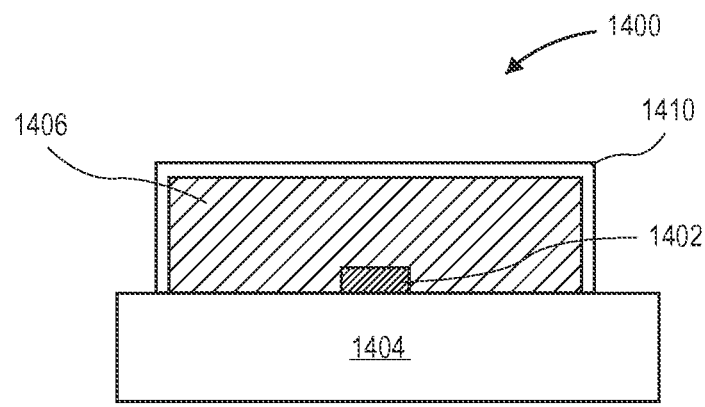
FIG. 14 illustrates a cross-sectional view of a lighting device with a layer having a composition with a dispersion of quantum dots therein, in accordance with another embodiment of the present invention.

In another example, FIG. 14 illustrates a cross-sectional view of a lighting device 1400 with a layer having a composition with a dispersion of quantum dots therein, in accordance with another embodiment of the present invention. Referring to FIG. 14, the lighting device 1400 includes a blue LED structure 1402 supported on a substrate 1404 which may house a portion of the electrical components of the blue LED structure 1402. A single conversion layer 1406 has a composition that includes a dispersion of red-light emitting anisotropic quantum dots in combination with a dispersion of green quantum dots or green and/or yellow phosphors therein. Optionally, a sealing layer 1410 may be formed over the single conversion layer 1406, as depicted in FIG. 14. In one embodiment, the device 1400 can be used to generate white light.

Figure 15A:
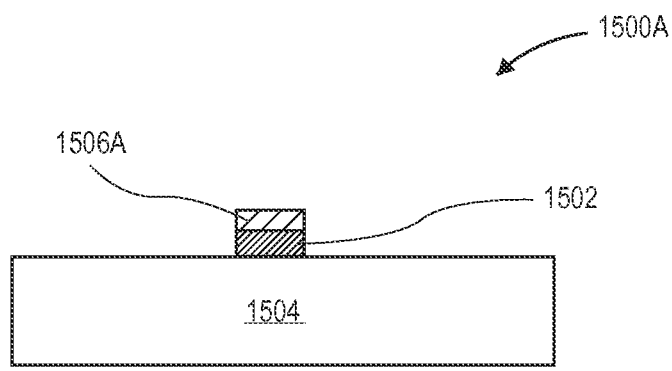
FIGS. 15A-15C illustrate cross-sectional views of various configurations for lighting devices with a layer having a composition with a dispersion of quantum dots therein, in accordance with another embodiment of the present invention.
Figure 15B:
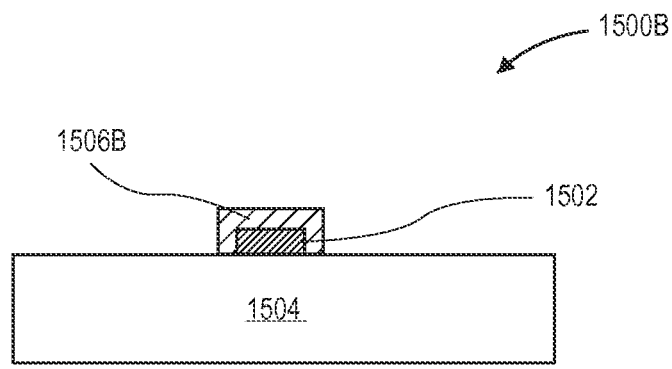
Figure 15C:
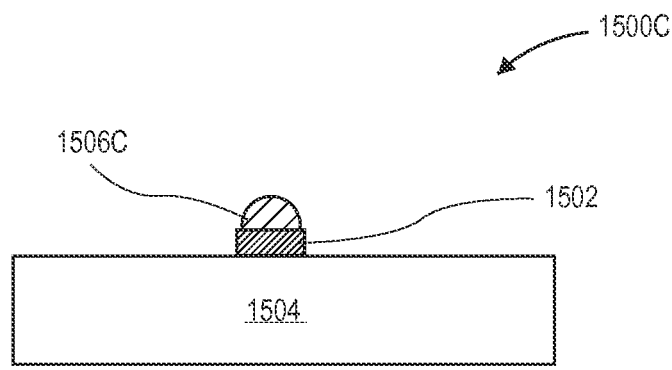

In additional examples, FIGS. 15A-15C illustrate cross-sectional views of various configurations for lighting devices 1500A-1500C with a layer having a composition with a dispersion of quantum dots therein, respectively, in accordance with another embodiment of the present invention. Referring to FIGS. 15A-15C, the lighting devices 1500A-1500C each include a blue LED structure 1502 supported on a substrate 1504 which may house a portion of the electrical components of the blue LED structure 1502. A conversion layer 1506A-1506C, respectively, has a composition that includes a dispersion of one or more light-emitting color types of quantum dots therein. Referring to FIG. 1500A specifically, the conversion layer 1506A is disposed as a thin layer only on the top surface of the blue LED structure 1502. Referring to FIG. 1500B specifically, the conversion layer 1506B is disposed as a thin layer conformal with all exposed surfaces of the blue LED structure 1502. Referring to FIG. 1500C specifically, the conversion layer 1506C is disposed as a "bulb" only on the top surface of the blue LED structure 1502. In the above examples (e.g., FIGS. 10-14 and 15A-15C), although use with a blue LED is emphasized, it is to be understood that a layer having a composition with a dispersion of quantum dots therein can be used with other light sources as well, including LEDs other than blue LEDs.

Thus, quantum dot delivery methods have been disclosed.

What is claimed is:

1. An apparatus for fabricating an LED with a composite layer including quantum dots (QDs), wherein the QDs are provided in a silicone paste to the apparatus, comprising:
   a plurality of QD silicone paste reservoirs each containing a provided silicone paste with QDs of different wavelengths;
   a silicone paste reservoir containing a clear silicone paste;
   a paste mixing chamber, into which the QD paste reservoirs and the silicone paste reservoir supply their respective pastes, to mix together the pastes and form a mixed QD silicone paste;
   a silicone mixing and metering tool to receive the mixed QD silicone paste from the paste mixing chamber, and further receive an A silicone and a B silicone from a respective A silicone reservoir and a B silicone reservoir, measure, and mix the mixed QD silicone paste with the A and B silicones to form a silicone polymer composite;
   a dispensing tool to receive the silicone polymer composite from the mixing and metering tool and dispense the composite to a molding tool.

2. The apparatus of claim 1, further comprising the molding tool to receive and apply a layer of the composite onto an LED device.

3. The apparatus of claim 2, further comprising a curing tool to receive and cure the layer of the composite as applied to the LED device.

4. The apparatus of claim 3, further comprising a performance test tool to receive and test the performance of the LED device with the layer of the composite.

5. The apparatus of claim 4, wherein the performance of the LED device is measured for one or more of color temperature, CRI, color coordinates, optical flux density, and lighting efficacy.

6. The apparatus of claim 2, wherein the paste mixing chamber to mix together the pastes in ratios that meet color requirements of the LED device.

7. The apparatus of claim 6, wherein the paste mixing chamber to mix together the pastes in ratios that meet color requirements of the LED device comprises the paste mixing chamber to mix together the pastes in ratios that achieve or more of color coordinates, color temperature, and color rendering index for the LED device.

* * * * *